(12) United States Patent
Calka

(10) Patent No.: US 12,016,129 B2
(45) Date of Patent: Jun. 18, 2024

(54) PRINTED CIRCUIT BOARD (PCB) AND METHOD OF MAKING THE SAME

(71) Applicant: ZF CV Systems Europe BV, Brussels (BE)

(72) Inventor: Marcin Calka, Wroclaw (PL)

(73) Assignee: ZF CV Systems Europe BV, Brussels (BE)

( * ) Notice: Subject to any disclaimer, the term of this patent is extended or adjusted under 35 U.S.C. 154(b) by 254 days.

(21) Appl. No.: 17/837,942

(22) Filed: Jun. 10, 2022

(65) Prior Publication Data

US 2022/0400555 A1 Dec. 15, 2022

(30) Foreign Application Priority Data

Jun. 11, 2021 (EP) ..................................... 21178916

(51) Int. Cl.
*H05K 3/12* (2006.01)
*H05K 3/10* (2006.01)

(52) U.S. Cl.
CPC .......... *H05K 3/1216* (2013.01); *H05K 3/108* (2013.01); *H05K 2203/167* (2013.01)

(58) Field of Classification Search
CPC . H05K 3/1216; H05K 3/108; H05K 2203/167
USPC ........................................................ 174/250
See application file for complete search history.

(56) References Cited

U.S. PATENT DOCUMENTS

| 2008/0092376 | A1* | 4/2008 | Magera | H05K 3/205 |
| | | | | 29/830 |
| 2010/0139561 | A1* | 6/2010 | Bloom | H05K 3/1225 |
| | | | | 118/504 |
| 2011/0259222 | A1* | 10/2011 | Tanaka | B41F 35/005 |
| | | | | 134/6 |
| 2017/0150611 | A1* | 5/2017 | Zhang | H05K 3/1216 |

FOREIGN PATENT DOCUMENTS

| EP | 0 915 641 A1 | 5/1999 |
| GB | 2480579 A | 11/2011 |

OTHER PUBLICATIONS

Search Report of the European Patent Office dated Dec. 7, 2021 for European application 21178916.9 on which this application is based.

* cited by examiner

*Primary Examiner* — Timothy J Thompson
*Assistant Examiner* — Michael F McAllister
(74) *Attorney, Agent, or Firm* — Walter Ottesen, P.A.

(57) ABSTRACT

The disclosure is directed to a printed circuit board for mechanical support and electrical connection of electrical or electronic components. The printed circuit board has conductive tracks and contact pads carved away or etched from at least one sheet layer of copper laminated onto a non-conductive substrate and has a label attached to the printed circuit board at an intended position before the assembly process. Soldering defects often occur due to the deposition of excessive amounts of solder paste on the contact pads of components adjacent to the label. To prevent soldering (Continued)

defects caused by incorrect solder paste application quantities by simple and inexpensive means, the printed circuit board provides the intended position of the label as a depression with respect to the surroundings thereof.

9 Claims, 2 Drawing Sheets

State of the art

PRINTED CIRCUIT BOARD (PCB) AND METHOD OF MAKING THE SAME

CROSS REFERENCE TO RELATED APPLICATION

This application claims priority of European patent application no. 21178916.9, filed Jun. 11, 2021, the entire content of which is incorporated herein by reference.

TECHNICAL FIELD

The disclosure relates to a printed circuit board for mechanical support and electrical connection of electrical or electronic components, with a label attached to the printed circuit board before the assembly process. The disclosure also relates to a method for making the printed circuit board.

BACKGROUND

A printed circuit board (PCB) mechanically supports and electrically connects electrical or electronic components. In PCB manufacturing, once the PCB size has been determined, the components specified in the circuit diagram and parts list are placed on the PCB in such a way that electrical connection is provided with respect to EMC, thermal, assembly rules and others using conductive tracks, pads and other features carved away or etched from one or more sheet layers of copper laminated onto and/or between sheet layers of a non-conductive substrate.

Usually a solder mask is applied at least to the conductive tracks for protection against oxidation and to prevent solder bridges from forming between closely spaced contact pads.

In surface-mount technology (SMT), the electrical components are mounted onto the surface of a printed circuit board (PCB) in order to connect the components. Components are generally soldered onto the PCB to both electrically connect and mechanically fasten them to it. A solder paste is deposited onto the contact pads and usually printed via a reflow stencil. After subsequently equipping the PCB with components at their designated contact pads, the assembly is subjected to controlled heat to reflow the solder paste in a molten state and create permanent solder joints.

Automated assembly, processing, test and packaging systems usually include automatic identification. A label providing bar code or data matrix-code information or any other data in a visual, machine-readable form is normally attached to a printed circuit board before the assembly process to enable automatic identification and traceability.

It has been found that soldering defects often occur due to the deposition of excessive amounts of solder paste on the pads of adjacent components. It has been found out, that excessive amounts of solder paste are added when the reflow stencil is locally raised from the label above the desired level. In other words, a label that rises from the printed circuit board can cause the reflow stencil to rise locally. As a result, the printing process causes incorrect solder paste volume to be deposited on the pads of adjacent components, which ultimately leads to soldering defects.

Additional distances between the label and surface-mounted components are not acceptable, as the reduction in PCB size is a crucial aspect. To give the label more space and to counteract the described soldering error, a reflow template with a recess in the area of the label has already been suggested. In this case of a custom-made product, the reflow stencil would be very expensive.

SUMMARY

It is an object of the disclosure to prevent soldering defects caused by incorrect solder paste application quantities simply and inexpensively.

According to the disclosure, the printed circuit board provides the intended position of the label as a depression with respect to its surroundings. The depression prevents the reflow stencil from lifting off. Due to the depression, the reflow stencil is placed flatways, which ensures the expected result of the solder paste print.

The depression (or pocket) is made by the PCB manufacturer without any significant effort during the standard processes. In a first embodiment of the disclosure, space is created for the label by providing the intended position of the label as a copper-free area.

According to a second aspect of the disclosure, a solder mask, which is applied at least to the conductive tracks, includes an opening area which overlaps (and defines) the intended position to apply the label. Due to the omission of copper or solder mask, printed circuit boards have a depression at the designated position of the label.

More space for attaching labels is provided in an advantageous embodiment of the disclosure, in which the intended position of the label is determined by providing both a copper-free area and a solder mask with an opening area that overlaps the intended position of the label.

BRIEF DESCRIPTION OF THE DRAWINGS

The invention will now be described with reference to the drawings wherein.

DESCRIPTION OF THE PREFERRED EMBODIMENTS

Figure 1:
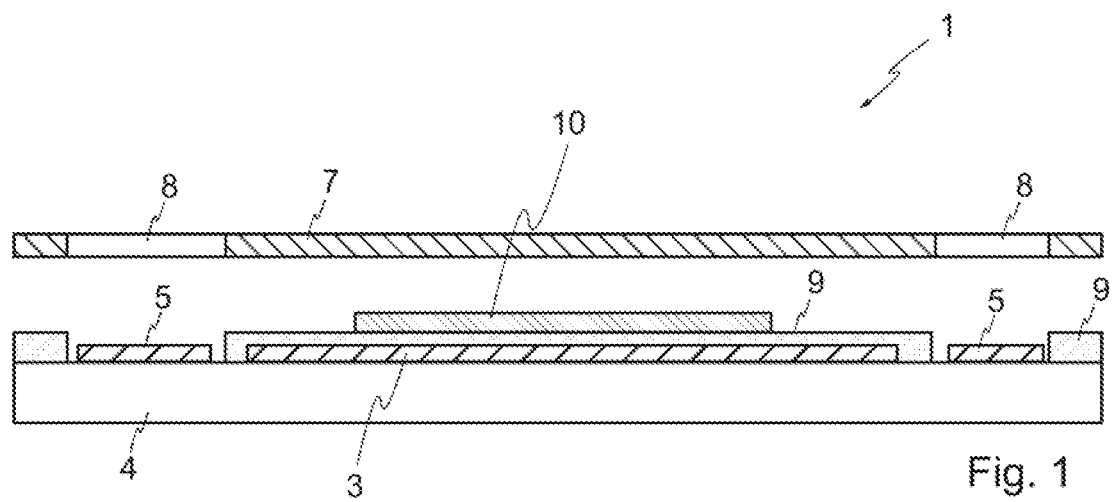
FIGS. 1 to 3 depict a printed circuit board according to the state of the art and a method to manufacture the same; and, FIGS. 4 to 6 depict an embodiment of a printed circuit board according to the disclosure and a method to manufacture the same.
Figure 2:
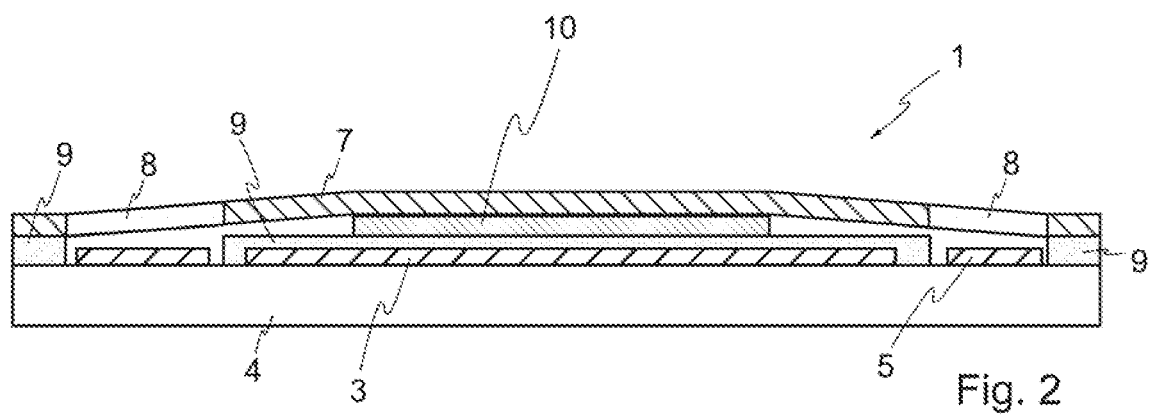
Figure 3:
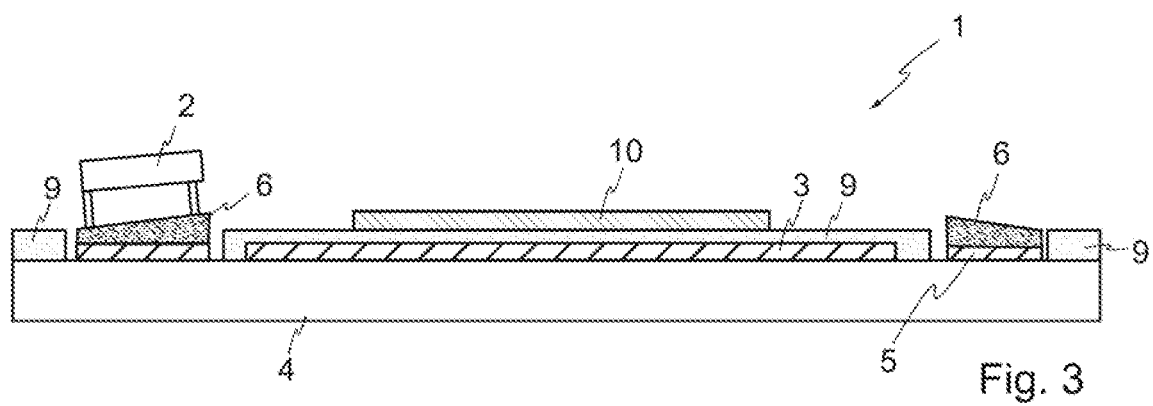
Figure 4:
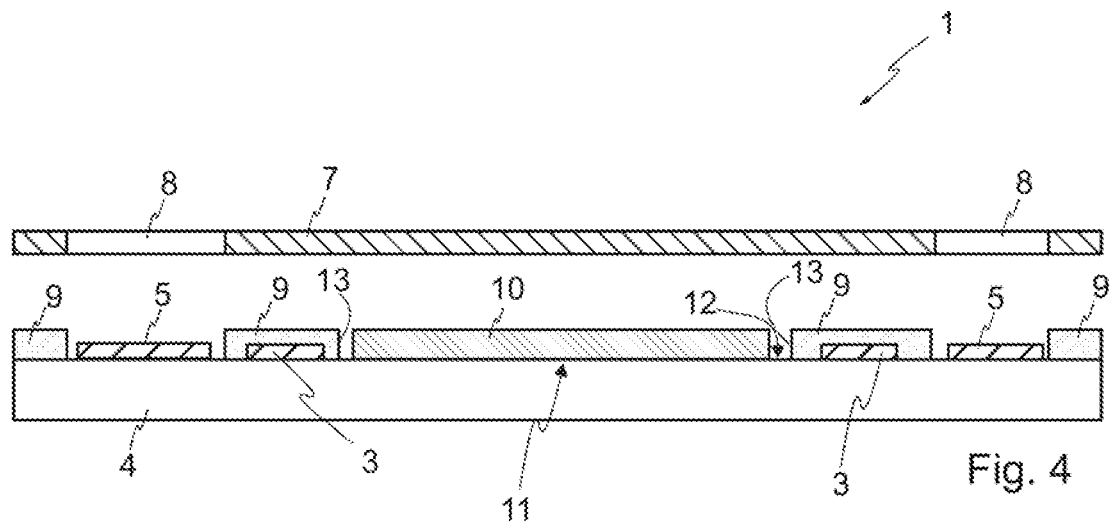
Figure 5:
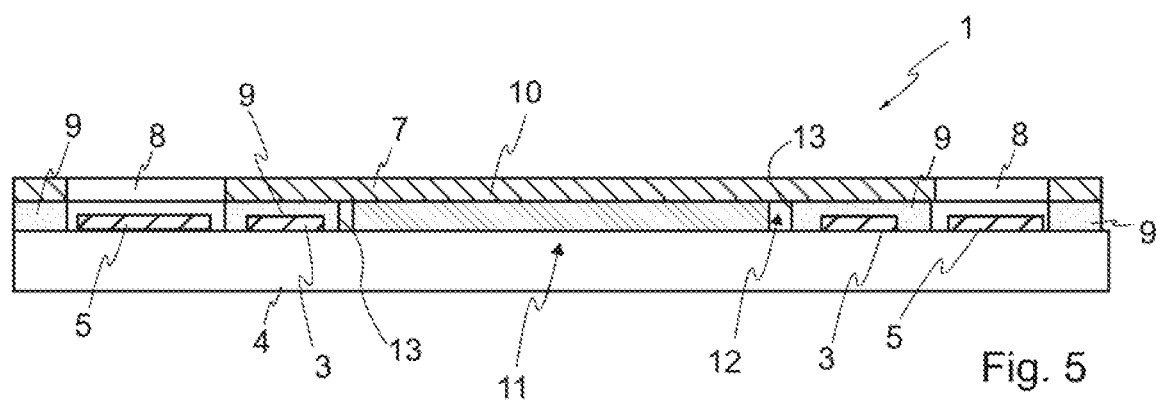
Figure 6:
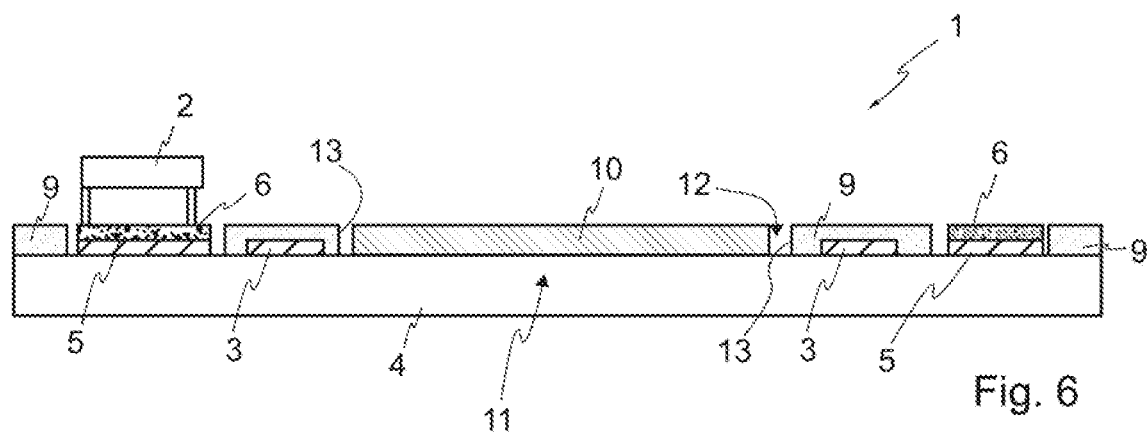

In all drawing figures, identical reference numbers are used for those elements of a PCB which have a similar function both in the state of the art and in the embodiment according to the disclosure. However, this does not necessarily imply that the elements designated in FIG. 4, FIG. 5 and FIG. 6 are identical with the elements in FIG. 1, FIG. 2 and FIG. 3, which are designated with corresponding reference numerals. The differences are explained in each case to illustrate the invention.

FIGS. 1 to 3 and FIGS. 4 to 6 each illustrate three important states in the assembly process of a printed circuit board (PCB) 1 using the so-called surface mounting technology. PCB 1 serves to both mechanically support and electrically connect the electrical or electronic components 2 arranged thereon. In Surface-mount technology, components have small metal tabs or end caps that can be soldered directly onto the PCB surface, instead of wire leads to pass through holes.

Printed circuit boards are usually manufactured with copper as the conductive component, which is plated as one or more sheet layers of copper 3 onto a non-conductive substrate 4. The copper layer 3 is cut away or etched according to the intended configuration of the PCB 1 to expose conductive tracks and contact pads 5 for components 2.

To solder the components 2 a solder paste 6 is deposited onto the contact pads 5 and usually printed by a reflow stencil 7. The reflow stencil 7 is flat and has perforations 8 which allow solder paste 6 to pass through and a deposit of the solder paste 6 to be printed on the PCB 1. The contact pads 5 printed with solder paste 6 are then fitted with the components 2.

Reference number 9 indicates a solder mask applied at least to the conductive tracks for protection against oxidation and to prevent solder bridges from forming between closely spaced contact pads 5.

The assembly is finally subjected to controlled heat to reflow the solder paste 6 in a molten state and create permanent solder joints. In this context the solder mask 9 is also baked and attached to the PCB 1.

Attached to the PCB 1 is a label 10 providing bar code or datamatrix-code information or any other data in a visual, machine-readable form. The label 10 is applied to the surface of the PCB to ensure its legibility. The label 10 is placed in an area of the PCB 1 that is free of components 2. As there are no contact pads 5 or carved out tracks in this intended position 11, in the conventional arrangement according to FIG. 1 to FIG. 3, the label 10 is placed on the solder mask 9 and the copper layer 3 underneath. Label 10 must have a certain thickness, especially as it must cope with high temperatures during the soldering process and the chemicals used during a cleaning process.

The label 10 therefore rises above the level of its surroundings, so that the reflow stencil 7 rests on the label 10 when reflow paste printing on the PCB 1. In the conventional procedure (FIG. 1 to FIG. 3) the reflow stencil 7 is pressed beyond the level of the label 10 creating a shifted cross-section of the stencil's perforations 8 and a free space in the area of the perforation 8 of the solder stencil 7, which causes excessive amounts of solder paste 9 to be applied to the contact pad 3.

According to the disclosure, the intended position 11 of the label is provided in the printed circuit board 1 according to FIG. 4 to FIG. 6 as a depression 12 with respect to the surroundings. This counteracts undesired lifting of the reflow stencil 7 and prevents excessive amounts of solder paste 6 from being applied.

In order to create the wanted depression 12 the intended position 11 of the label 10 is provided as a no copper area. The depression 12 (or pocket) is made by the PCB manufacturer without any significant effort during the standard processes. In a first alternative, the formation of the copper-free area of the intended position 11 is carried out by etching the copper layer 3 in conjunction with the formation of the conductive tracks and the contact pads 5.

In a second alternative, the depression 12 to accommodate the label 10 is created by forming a solder mask 9 with an opening area 13 that overlaps the intended position 11 of the label 10. In other words, solder mask 9 is omitted in the area of the intended position 11 of the label 10 so that the desired depression 12 is formed in the intended position 11 by the surroundings of solder mask 9 and copper layer 3 underneath. The opening area 13 of the solder mask 9 for the purpose of creating a depression 12 to accommodate the label 10 can also be provided with little effort when applying the solder mask 9 in a conventional application process. Solder mask 9 is applicated before printing the solder paste 6 so wanted solder mask 9 is baked on to the PCB 1.

In the example of the disclosure according to FIG. 4 to FIG. 6, deep depression 12 with more space for attaching labels 10 is created by providing both a copper-free area at the intended position 11 of the label and a solder mask 9 with an opening area 13 that overlaps the intended position 11 of the label 10.

It is understood that the foregoing description is that of the preferred embodiments of the invention and that various changes and modifications may be made thereto without departing from the spirit and scope of the invention as defined in the appended claims.

LIST OF REFERENCE NUMERALS (PART OF THE DESCRIPTION)

1 Printed circuit board (PCB)
2 Electronic component
3 Copper layer
4 Non-conductive substrate
5 Contact pad
6 Solder paste
7 Reflow stencil
8 Perforation
9 Solder mask
10 Label
11 Intended position
12 Depression
13 Opening area

What is claimed is:

1. A printed circuit board for mechanically supporting and electrically connecting electrical or electronic components, the printed circuit board comprising:
   a non-conductive substrate having at least one sheet layer of copper laminated onto said substrate;
   said sheet layer of copper having conductive tracks and contact pads carved or etched away therefrom;
   a label attached to said printed circuit board at an intended position within predetermined surroundings in advance of an assembly process; and,
   said intended position being provided by said printed circuit board as a depression with respect to said predetermined surroundings.

2. The printed circuit board of claim 1, wherein said intended position of said label is provided as a copper-free area.

3. The printed circuit board of claim 1, wherein a solder mask is applied at least to said conductive tracks; and, an opening area overlaps said intended position of said label.

4. The printed circuit board of claim 2, wherein said intended position of said label provides both a copper-free area and a solder mask with an opening area that overlaps said intended position of said label.

5. A method of making a printed circuit board for mechanically supporting and electrically connecting electrical or electronic components, the method comprising the steps of:
   laminating at least one sheet layer of copper to a non-conductive substrate and carving or etching conductive tracks and contact pads from the sheet layer of copper;
   attaching a label to the printed circuit board at an intended position within predetermined surroundings; and,
   forming the intended position of the label as a depression with respect to the predetermined surroundings thereof.

6. The method of claim 5, wherein the intended position of the label is provided as a copper-free area.

7. The method of claim 5, wherein the depression is provided by a solder mask applied to at least the conductive tracks and including an opening area overlapping the intended position of the label.

8. The method of claim 6, wherein the intended position of the label is provided by both a copper-free area and a solder mask with an opening area overlapping the intended position of the label.

9. The method of claim 6, wherein the copper-free area of the intended position of the label is etched from the sheet layer of copper.

* * * * *